United States Patent
Takahashi et al.

(10) Patent No.: US 6,542,783 B2
(45) Date of Patent: Apr. 1, 2003

(54) TOOL POSITION MEASUREMENT METHOD, OFFSET MEASUREMENT METHOD, REFERENCE MEMBER AND BONDING APPARATUS

(75) Inventors: Kuniyuki Takahashi, Musashimurayama (JP); Shinji Maki, Fussa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 194 days.

(21) Appl. No.: 09/782,889

(22) Filed: Feb. 12, 2001

(65) Prior Publication Data

US 2001/0016786 A1 Aug. 23, 2001

(30) Foreign Application Priority Data

Feb. 10, 2000 (JP) ........................................ 2000-033046

(51) Int. Cl.[7] .............................................. G15B 19/18
(52) U.S. Cl. ........................................ 700/58; 700/195
(58) Field of Search ............................. 700/58, 57, 59, 700/114, 195; 228/108.5; 332/151

(56) References Cited

U.S. PATENT DOCUMENTS 5,357,450 A * 10/1994 Hemmerle et al. ......... 700/176
5,812,407 A * 9/1998 Sato et al. .................. 700/193
6,362,014 B1 * 3/2002 Takahashi et al. ............ 438/14

FOREIGN PATENT DOCUMENTS

JP    S59-69939    4/1984

* cited by examiner

Primary Examiner—Leo Picard
Assistant Examiner—Kidest Bahta
(74) Attorney, Agent, or Firm—Koda & Androlia

(57) ABSTRACT

So as to achieve accurate detection of the bonding tool position in, for instance, a wire bonding apparatus, the positional relationship between a position detection camera and a reference hole formed in, for instance, a clamper is measured by imaging the reference hole by the position detection camera. The position detection camera and a bonding tool are moved by an XY table, and the tip end of the bonding tool is inserted into the reference hole. Then, the bonding tool is moved in the X and Y directions, and the contact of the bonding tool to an edge of the reference hole is detected based upon changes in the waveform of the ultrasonic vibrations applied to the bonding tool, thus measuring the positional relationship between the tool and the reference hole. The offset amount between the position detection camera and the bonding tool is then determined based upon the measured values and the amounts of movement of the bonding tool between the locations for such measured values.

6 Claims, 6 Drawing Sheets

TOOL POSITION MEASUREMENT METHOD, OFFSET MEASUREMENT METHOD, REFERENCE MEMBER AND BONDING APPARATUS

BACKGROUND OF THE INVENTION

1. Field of the Invention

The present invention relates to a tool position measurement method which is used for the precise measurement of the position of a tool that processes an object to be processed in a processing apparatus such as a semiconductor device assembly apparatus, etc., and the present invention further relates to an offset measurement method, a reference member and a bonding apparatus which are associated with the tool position measurement method.

2. Prior Art

In wire bonding apparatuses, for instance, the bonding head which is mounted on an XY table has a position detection camera and a bonding arm. The position detection camera images reference patterns on an object to be bonded such as semiconductor devices, etc., in order to specify the bonding points on the object to be bonded. The bonding arm is provided with a bonding tool (called "tool") at one end thereof so that the bonding tool performs bonding. The position detection camera and the bonding arm are installed on the bonding head with the optical axis of the position detection camera and the axial center of the tool separated from each other by a fixed distance. Thus, the tool and the bonding arm are prevented form interfering with the visual field of the position detection camera when the position detection camera images reference patterns on the object to be bonded. Generally, the distance between the optical axis of the position detection camera and the axial center of the tool is called an "offset".

The position detection camera determines a reference point for the purpose of ascertaining the position to which the tool is to be moved. Accordingly, it is extremely important to know exactly how far the position detection camera is offset from the tool. However, the actual offset amount between the position detection camera and the tool varies from instant to instant as a result of, for instance, deformation of the camera holder and bonding arm caused by radiant heat from the high-temperature bonding stage. Accordingly, it is necessary to correct the offset amount when bonding operations are initiated and with an appropriate timing during bonding operations.

A method for accomplishing the above purpose is shown in, for example, Japanese Patent Application Laid-Open (Kokai) No. S59-69939. In this method, a pressure mark is formed by a bonding tool in an appropriate location within the bonding range, the position of the bonding tool is detected by detecting the position of this pressure mark by a position detection camera, then the amount of offset is corrected based upon this position. Furthermore, in this method, the coordinates of the center of the pressure mark are determined by performing specified image processing on image data obtained by photoelectric conversion from the position detection camera, and the amount of offset is calculated based upon these coordinates.

However, in this conventional structure, the pressure marks of the tool are not always clear. Furthermore, unlike special patterns that are suitable for image processing, individual pressure marks show different shapes. Accordingly, the above-described detection method is not always accurate.

BRIEF SUMMARY OF THE INVENTION

The present invention is to solve the above problems.

The object of the present invention is to provide a novel means that can accurately detect the position of a tool such as a bonding tool.

The above-object is accomplished by a tool position measurement method of the present invention in which:

a tool that performs a processing operation on an object to be processed is caused to approach a reference member disposed in a fixed position, the approach being made in a direction which crosses the direction of the processing operation of the tool, and a positional relationship between the tool and the reference member is measured by detecting the contact between the tool and the reference member.

In the above method, the tool (a bonding tool, for instance) is caused to approach the reference member in a direction which crosses the direction of the processing operation that is done by the tool, and the positional relationship between the tool and the reference member is measured by detecting the contact between the tool and the reference member. In other words, the positional relationship between the tool and the reference member is measured by means of the contact that occurs between the tool and the reference member when the tool is caused to approach the reference member. Accordingly, the position of the tool can be determined more clearly and accurately than in a conventional method in which the measurement is done on a pressure mark. The reference member is provided exclusively for this purpose; and alternatively, a portion of the components of a bonding apparatus may be used as this reference member. It is also possible to use the object to be processed as a reference member.

The above object is further accomplished by unique steps of the present invention for an offset measurement method used in a processing apparatus that includes:

a position detection imaging device that images an object to be processed, and a tool which is installed in an offset fashion with respect to the position detection imaging device and performs a processing operation on the object to be processed, and the unique steps of the present invention comprises:

a step in which the positional relationship between the position detection imaging device and the reference member disposed in a fixed position is measured by the position detection imaging device in a first attitude in which the position detection imaging device is caused to face the reference member, a step in which the positional relationship between the tool and the reference member is measured by causing the tool to approach the reference member and detecting the contact between the tool and the reference member in a second attitude in which the tool is caused to face the reference member, and a step in which the offset amount is determined based upon the measurement results and the amounts of movement of the position detection imaging device and the tool between the first attitude and second attitude.

In the above method, the positional relationship between the tool (bonding toll) and the reference member is measured by measuring the positional relationship between the position detection imaging device (camera, for instance) and the reference member by means of the position detection imaging device in the first attitude in which the position detection imaging device is caused to face the reference member, and then by causing the tool to approach the reference member and detecting the contact between the tool and the reference member in the second attitude in which the tool is caused to face the reference member. Then, the offset amounts are determined based upon these measurement results and the amounts of movement of the position detection imaging device and tool between the first and second attitudes. In this method, in regard to the order in which the measurement in the first attitude and the measurement in the second attitude are performed, either measurement can be performed first. The measurement of the positional relationship between the tool and the reference member in the first attitude is accomplished by causing the tool to approach the reference member and detecting the contact between the tool and the reference member. Accordingly, the position of the tool can be clearly and accurately determined.

In the above offset measurement method, in the second attitude, the tool and the reference member are caused to approach each other in a direction which crosses the direction of the processing operation of the tool.

Since the tool (bonding tool) and reference member are caused to approach each other in a direction which crosses the direction of the processing operation (bonding) of the tool in the second attitude. Accordingly, the position of the tool can be determined more clearly and accurately than in the conventional method that depends on the measurement of a pressure mark.

Furthermore, in the present invention, the detection of the contact between the tool and the reference member can be accomplished based upon variations in a vibration that is applied to the tool.

In this method, the detection of the contact between the bonding tool and the reference member is accomplished based upon the variations in a vibration that is applied to the tool. Accordingly, this method can be easily applied to an apparatus in which detection of the contact between a tool and an object to be processed is accomplished based upon the variations in a vibration that is applied to the tool.

Furthermore, the present invention provides a reference member which is held in a fixed position. This reference member is characterized in that the reference member comes into contact with the tool when a tool (bonding tool) which performs a processing operation (such as bonding) on an object to be processed is moved in a direction that crosses the direction of the processing operation. With the use of this reference member of the present invention, the position of the tool can be determined clearly and accurately.

The above reference member can be a hole that is formed in a clamping member that holds the object to be processed.

In the above, a hole formed in a clamping member which holds the object to be processed is used as a reference member. Thus, the reference member can be provided close to the object to be processed, and the amount of movement of the tool between processing operations and offset correction operations can be extremely small.

In the above reference member of the present invention, the rim or the edge that defines the hole have sides that run along directions of coordinate axes that are used in detecting the position of the tool.

In the above structure, the edge of the hole has sides that run along the directions of the coordinate axes used in the detection of the position of the tool. Accordingly, the processing that converts position information into position coordinates in the position detection operations is performed easily.

Furthermore, the above-described object is accomplished by a unique structure of the present invention for a bonding apparatus that comprises:

a position detection imaging device that images an object to be bonded, and a tool which is installed so as to be offset with respect to the position detection imaging device and processes the object to be bonded, and the bonding apparatus is provided with an operation control device which determines the offset amount between the position detection imaging device and the tool based upon:

a measured value that is obtained when the positional relationship between the position detection imaging device and a reference member disposed in a fixed position is measured by the position detection imaging device in a first attitude in which the position detection imaging device is caused to approach the reference member, a measured value that is obtained when the positional relationship between the tool and the reference member is measured by detecting the contact between the tool and the reference member in a second attitude in which the tool is caused to approach the reference member, and amounts of movement of the position detection imaging device and the tool between the first attitude and second attitude.

With this bonding apparatus, the position of the tool (bonding tool) can be determined more clearly and accurately than in a conventional method that uses a pressure mark, and the offset amount between the position detection imaging device and the tool is measured with accuracy.

The above object is further accomplished by another unique structure of the present invention for a bonding apparatus that comprises:

a position detection imaging device that images an object to be bonded, a tool which is installed so as to be offset with respect to the position detection imaging device and which processes the object to be bonded, an XY table which moves the position detection imaging device and the tool as an integral unit, and a detection means which detects contact between the tool and the object to be bonded based upon variations in ultrasonic vibrations applied to the tool, and the bonding apparatus is provided with an operation control device which determines an offset amount between the position detection imaging device and the tool based upon:

a measured value that is obtained when the positional relationship between the position detection imaging device and a reference member disposed in a fixed position is measured by the position detection imaging device in a first attitude in which the position detection imaging device is caused to approach the reference member by the XY table, a measured value that is obtained when the positional relationship between the tool and the reference member is measured as a result of the contact between the tool and the reference member is detected by the detection means based upon variations in the ultrasonic vibrations applied to the tool in a second attitude in which the tool is caused to approach the reference member by the XY table, and an amount of movement of the XY table between the first attitude and second attitude.

With the above bonding apparatus, the position of the tool (bonding tool) can be determined clearly and accurately, and the offset amount between the position detection imaging device and the tool is measure with accuracy.

DETAILED DESCRIPTION OF THE INVENTION

Figure 1:
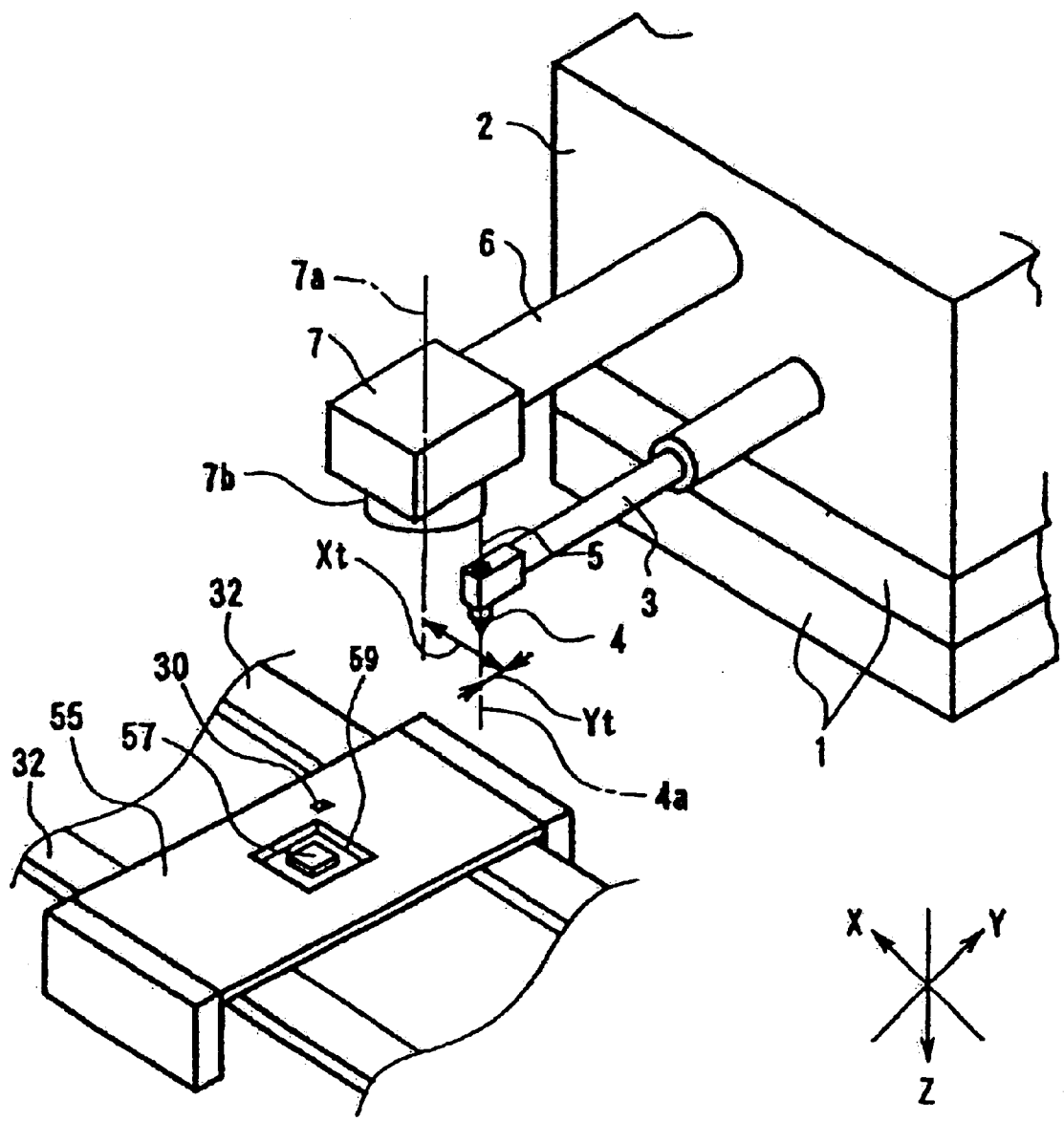
FIG. 1 is a perspective view of the essential portions of the bonding apparatus according to the present invention.

An embodiment of the present invention will be described below with reference to the accompanying drawings. FIG. 1 shows a wire bonder used in the embodiment of the present invention.

As shown in FIG. 1, a bonding arm 3 is installed on a bonding head 2 which is mounted on an XY table 1. The bonding arm 3 is driven in the vertical direction (i.e., the Z direction, which is the direction of the processing operation in the present invention) by a vertical driving means (not shown). A tool (bonding tool in the shown embodiment) 4 is attached to the tip end portion of the bonding arm 3, and a wire 5 is passed through this tool 4. A camera holder 6 is mounted on the bonding head 2, and a position detection camera 7 which is a photoelectric transducer type imaging device equipped with a charge-coupled device (CCD) is fastened to the tip end portion of the camera holder 6. The optical axis 7a of the position detection camera 7 and the axial center 4a of the tool 4 are both oriented vertically downward, i.e., in the Z direction. The optical axis 7a and axial center 4a are offset by offset amounts Xt and Yt in the X and Y directions. The XY table 1 is accurately moved in the X direction and Y direction by two pulse motors (not shown) which are installed in the vicinity of the XY table. Thus, the position detection camera 7 and tool 4 are moved as an integral unit in the X direction and Y direction while the offset amounts between the position detection camera 7 and tool 4 are maintained. The structures described so far are known in the prior art.

A semiconductor chip 57, which is the object to be processed (or bonded), is fastened to the surface of a lead frame (not shown). Lead frame conveying rails 32 are provided so as to convey the lead frame, and a window clamper 55 which straddles the lead frame conveying rails 32 is installed on the lead frame conveying rails 32. A jig (not shown) which contains a heater therein that is used to heat the semiconductor chip 57 is installed on the undersurface of the lead frame. The jig is raised and lowered by an appropriate driving mechanism (not shown). A driving means (not shown) that raises and lowers the window clamper 55 is also installed for the window clamper 55. Thus, the lead frame is held or clamped between the window clamper 55 and the jig during bonding operations by the raising and lowering movements of both of the window clamper 55 and the jig.

Figure 2:
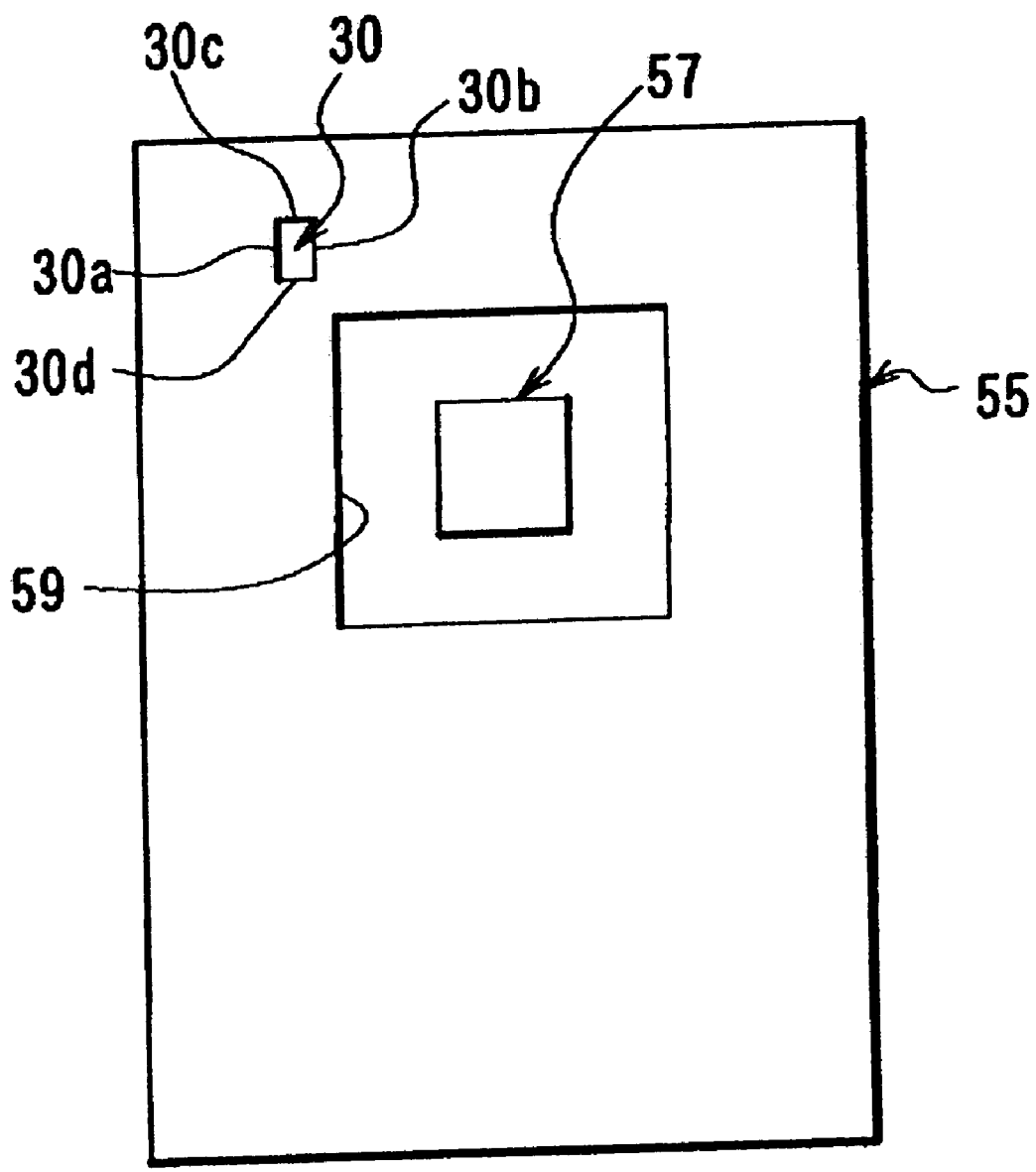
FIG. 2 is a top view of the window clamper used in the first embodiment.

A window 59 is formed in the window clamper 55 so that the semiconductor chip 57 and surrounding lead frame are viewed therethrough from above. Furthermore, a reference hole 30 which is a through-hole oriented in the vertical direction is formed in the vicinity of the window 59. As shown in FIG. 2, the reference hole 30 has a rectangular shape. The sides 30a and 30b oriented in the longitudinal direction and the sides 30c and 30d oriented in the lateral direction (with respect to FIG. 2) are respectively parallel to the Y axis and X axis, which are the coordinate axes used in detecting the position of the tool 4.

Figure 3:
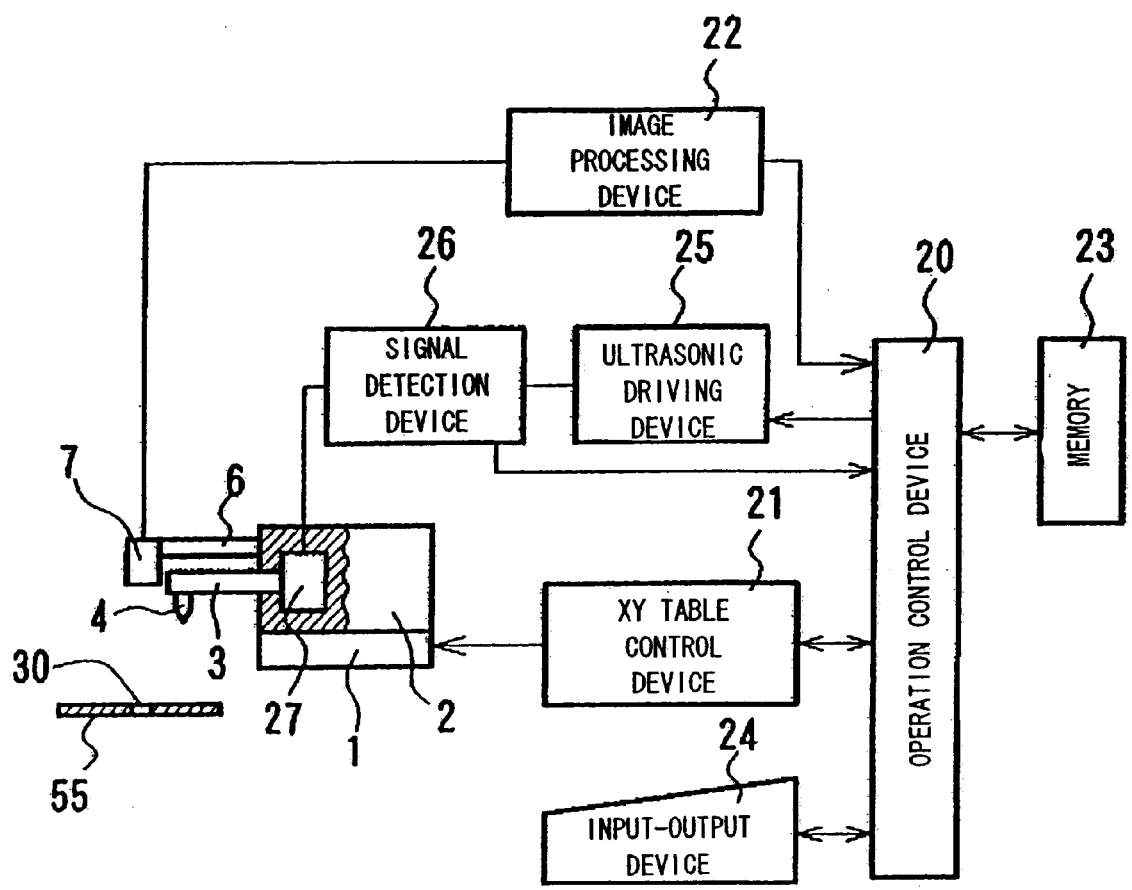
FIG. 3 is a block diagram which illustrates the control system.

As seen from FIG. 3, an ultrasonic transducer 27 which is used to apply ultrasonic vibrations to the tool 4 during bonding operations is installed in the base of the bonding arm 3. The ultrasonic transducer 27 is formed by alternately stacking a plurality of sets of electrostriction elements (piezo-electric elements) and electrodes. The ultrasonic transducer 27 applies ultrasonic vibrations to the object to be bonded of the semiconductor chip 57 via the bonding arm 3 and tool 4, and it also performs a bonding operation by means of the ultrasonic vibrations and the load from the tool 4. An ultrasonic driving device 25 that applies an alternating current to the ultrasonic transducer 27, and a signal detection device 26 which detects the current value, are connected to the ultrasonic transducer 27. The signal detection device 26 adjusts the load of the tool 4 based upon variations in the current that accompany variations in the vibration of the tool 4 that occur when the tool 4 and semiconductor chip 57 contact each other. The signal detection device 26 has substantially the same structure as the signal detection device ordinarily used in a wire bonder of this type.

The XY table 1 is driven by commands from an operation control device 20 that is a computer via an XY table control device 21. Images acquired by the position detection camera 7 are converted into electrical signals and processed by an image processing device 22, and the accurate offset amounts Xt and Yt (see FIG. 1) are calculated by the operation control device 20 based upon the processed images using a method that will be described later. Offset amounts Xw and Yw are stored beforehand in a memory 23. An input-output device 24 is connected to the operation control device 20.

Where ΔX and ΔY are the differences between the accurate offset amounts Xt and Yt and the offset amounts Xw and Yw stored beforehand in memory; then the accurate offset amounts Xt and Yt, the offset amounts Xw and Yw, and the offset correction amounts ΔX and ΔY have the relationship shown in Numerical Expression 1.

Numerical Expression 1

$$Xt = Xw + \Delta X$$

$$Yt = Yw + \Delta Y$$

Next, the method used to calculate the offset amounts Xt and Yt will be described.

Figure 4:
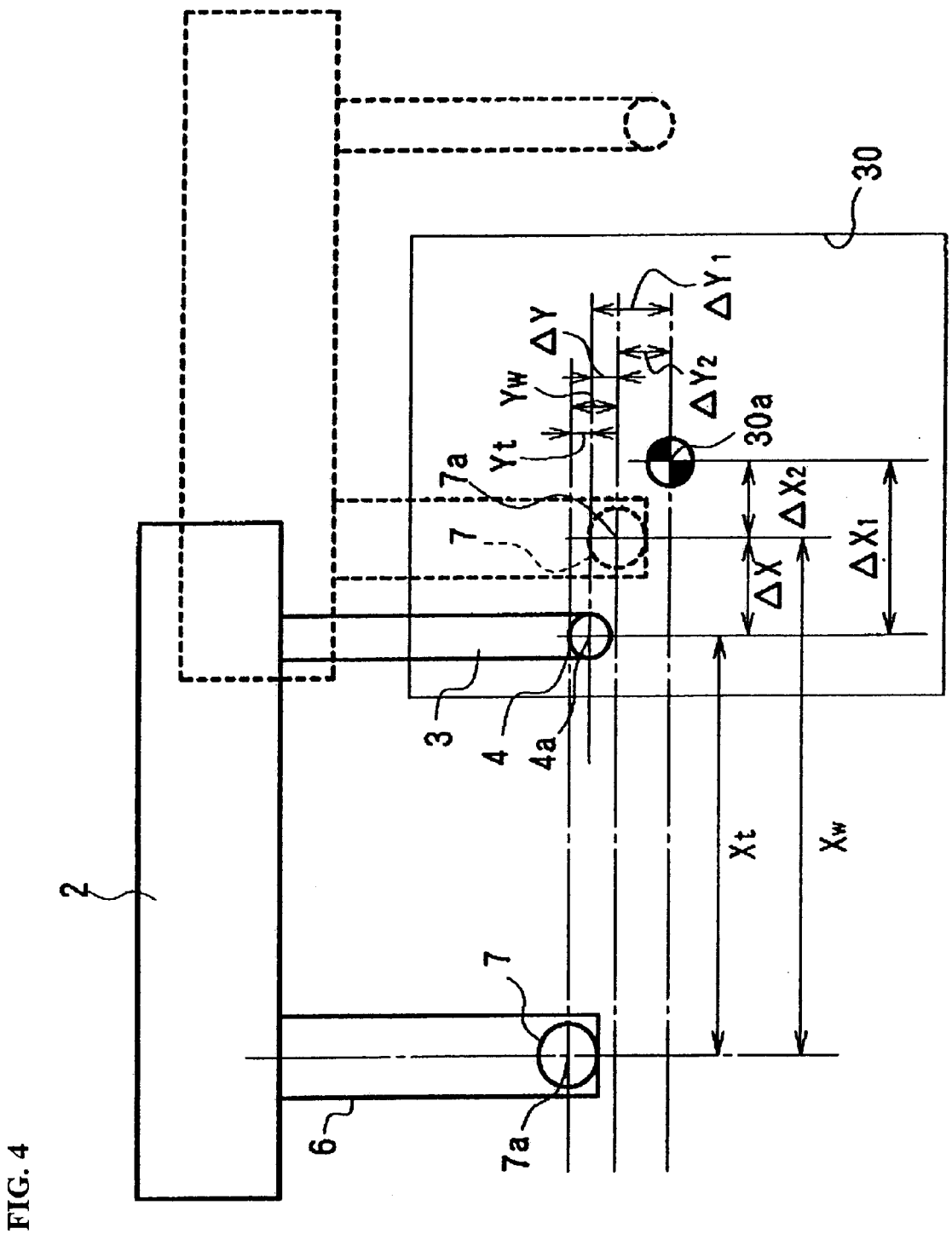
FIG. 4 is a top view of the positional relationship of the bonding tool, position detection camera and reference hole during offset correction process.

First, as indicated by the dotted line in FIG. 4, the position detection camera 7 is moved to a point above the reference hole 30. At this point in time, it is not necessary that the optical axis 7a of the position detection camera 7 coincide with the center 30a of the reference hole 30. Then, the reference hole 30 is imaged in this state, and the amounts of deviation $\Delta X_2$ and $\Delta Y_2$ between the axial center 30a of the reference hole 30 and the optical axis 7a of the position detection camera 7 are calculated by subjecting the resulting image to appropriate image processing. The attitude at the time of this imaging is the "first attitude" of the present invention.

Figure 5:
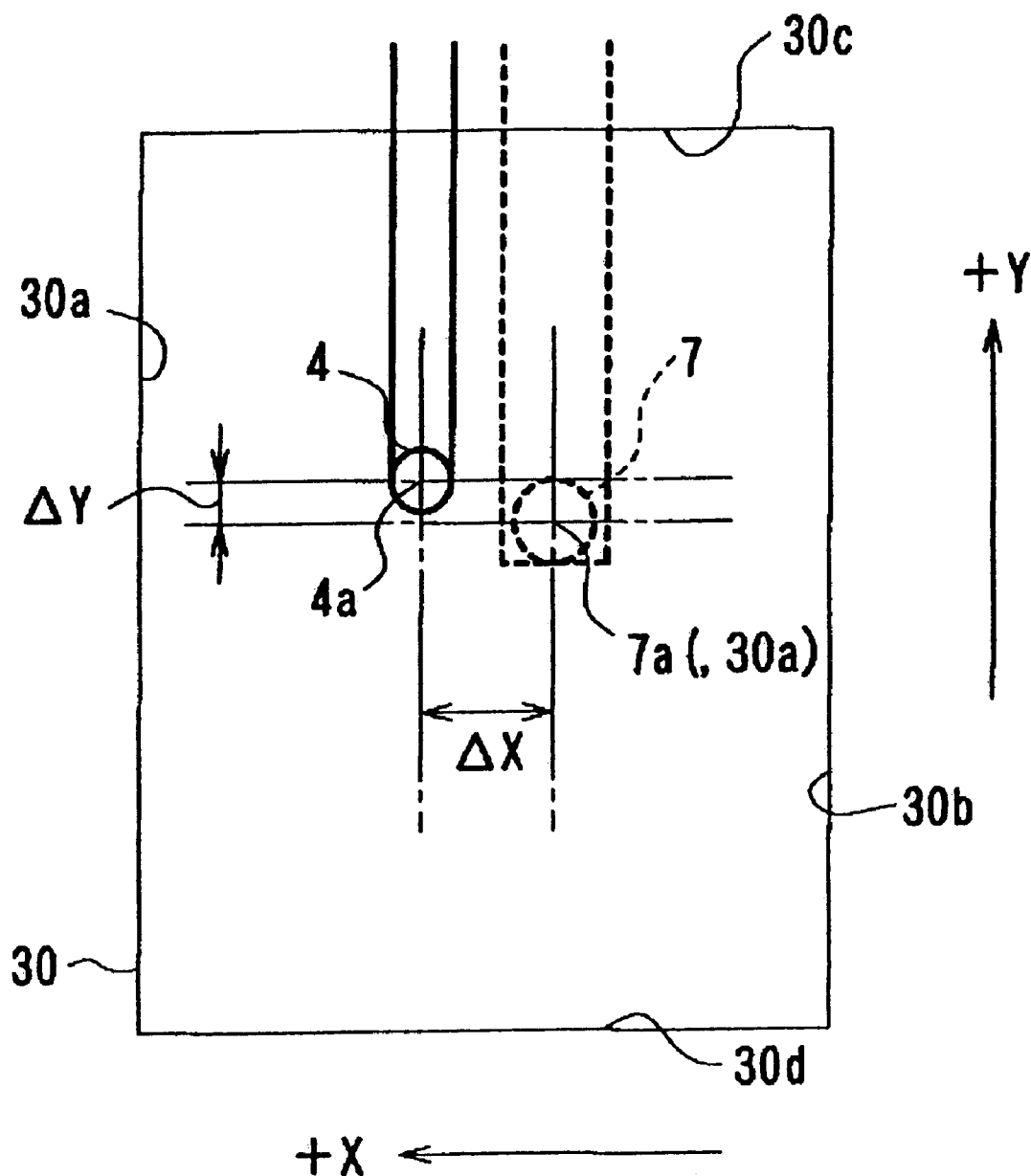
FIG. 5 is an enlarged top view of the window of the window clamper.

When the positional relationship between the position detection camera 7 and the reference hole 30 is measured, in other words, when the values of $\Delta X_2$ and $\Delta Y_2$, are measured, then the operation control device 20 drives the XY table 1 via the XY table control device 21 so that the position detection camera 7 is moved by a distance of $-\Delta X_2$, $-\Delta Y_2$. As a result, as shown by the dotted line in FIG. 5, the optical axis 7a of the position detection camera 7 is caused to coincide with the center 30a of the reference hole 30.

Next, the operation control device 20 drives the XY table 1 via the XY table control device 21 in accordance with the offset amounts Xw and Yw stored beforehand in the memory 23, so that the position detection camera 7 and tool 4 are moved by a distance of Xw and Yw. Furthermore, the tool 4 is lowered, and the tip end of the tool 4 is inserted in the reference hole 30 as shown by the solid line in FIG. 5.

Then, the ultrasonic transducer 27 is driven by the ultrasonic driving device 25, so that an ultrasonic vibration is applied to the tool 4, and in this state, the tool 4 is moved in the X direction at a slow, constant speed (for instance, a speed of a few pitches per second×a pitch of 0.1 $\mu$m), by the driving of the XY table 1. Here, since the tool 4 is not affected by any external force until the tool 4 contacts the edge that defines the reference hole 30, the waveform of the current applied to the ultrasonic transducer 27 during this time period does not change. However, when the tool 4 contacts the edge of the reference hole 30, the ultrasonic vibration is constrained by this contact, and a variation in impedance and phase occurs in the ultrasonic transducer 27. When this variation in impedance and phase is inputted in the operation control device 20 from the signal detection device 26, the operation control device 20 judges that the tool 4 has contacted the edge of the reference hole 30 in cases where the variation exceeds a specified reference value. Accordingly, the operation control device 20 stops the movement of the tool 4 and records the amount of movement of the tool 4 at the time of this contact in the memory 23.

Next, the tool 4 is driven in the −X direction at the same speed and brought to contact the edge of the reference hole 30 on the opposite side, and the amount of movement of the tool 4 at time of this contact is recorded.

Then, the average value of the amount of movement in the X direction using the movement starting point as a reference and the amount of movement in the −X direction similarly using the movement starting point as a reference is calculated. In other words, the X coordinate of the center 30a of the reference hole 30 is calculated. Further, the difference between this X coordinate of the center 30a and the position coordinate of the tool 4 prior to movement in the X direction is recorded as the amount of deviation $\Delta X$. The attitude at the time that this contact between the tool 4 and the reference hole 30 is detected is the "second attitude" of the present invention.

Movement and measurement of the tool 4 in the Y direction and −Y direction are likewise performed, and the Y coordinate of the center 30a of the reference hole 30 is thus calculated. Then, the difference between this Y coordinate of the center 30a and the position coordinate of the tool 4 prior to movement in the Y direction is recorded as the amount of deviation $\Delta Y$.

If the offset amounts Xw and Yw stored beforehand in memory are the accurate offset amounts Xt and Yt, then $\Delta X_1$ and $\Delta Y_1$ (see FIG. 4) coincide with $\Delta X_2$ and $\Delta Y_2$. Accordingly, the offset correction amounts $\Delta X$ and $\Delta Y$ is zero. However, if the offset amounts Xw and Yw that are stored in memory beforehand are approximate values, or if the offset amounts Xt or Yt change as a result of deformation of the camera holder 6 or bonding arm 3 caused by thermal effects, $\Delta X_1$ and $\Delta Y_1$ do not coincide with $\Delta X_2$ and $\Delta Y_2$, and the offset correction amounts $\Delta X$ and $\Delta Y$ are generated as errors between the two sets of values. Then, the above-described offset correction amounts $\Delta X$ and $\Delta Y$ is added to the offset amounts Xw and Yw stored beforehand in memory in accordance with Numerical Expression 1, thus calculating (obtaining) accurate offset amounts Xt and Yt; and the offset amounts Xw and Yw stored in the memory 23 are corrected (updated) to the accurate offset amounts Xt and Yt. The accurate offset amounts Xt and Yt thus determined are used as new offset amounts Xw and Yw of the position detection camera 7 and tool 4 in subsequent bonding operations.

As seen from the above, the tool 4 is caused to approach the reference hole 30 (with is disposed in a specified position) in a horizontal direction (X and Y directions) which crosses the direction of the processing operation of the tool 4, i.e., a substantially vertical direction (Z direction). The contact between the tool 4 and the reference hole 30 is then detected from the tool 4 side. The positional relationship between the tool 4 and the reference hole 30 is thus measured. In other words, the measurement of the positional relationship between the tool 4 and the reference hole 30 is accomplished using the contact that occurs between the tool 4 and the reference hole 30 when the tool 4 approaches the reference hole 30. Accordingly, the position of the tool 4 can be determined more clearly and accurately than in a conventional way that uses the measurement of a pressure mark.

In the above embodiment, the contact between the tool 4 and the reference hole 30 is detected based upon the variations in the ultrasonic vibrations that are applied to the tool 4. This method is especially easily used in an apparatus in which detection of the contact between the tool 4 and the semiconductor chip 57 is accomplished based upon vibration variations applied to the tool 4.

The reference hole 30 is formed in the window clamper 55 that holds the semiconductor chip 57. The structure is extremely simple. The reference hole 30 can be disposed in close proximity to the semiconductor chip 57. In addition, the amount of movement of the tool 4 between processing operations and offset correction operations can be very small.

Furthermore, the edge of the reference hole 30 has sides 30a, 30b, 30c and 30d that are oriented in the directions of the coordinate axes that are used in the detection of the position of the tool 4, i.e. in the X direction and Y direction. Accordingly, the conversion process that converts position information into position coordinates during the position detection operation is performed very easily.

The positional relationship between the tool 4 and the reference hole 30 is measured in the second attitude after the positional relationship between the position detection camera 7 and the reference hole 30 has been measured in the first attitude. The order of these measurements performed in the first attitude and second attitude can be reversed, and either measurement may be performed first.

Furthermore, the optical axis 7a of the position detection camera 7 and the center 30a of the reference hole 30 are temporarily aligned after the positional relationship between the position detection camera 7 and reference hole 30 has been measured in the first attitude. Then, the position detection camera 7 and tool 4 are moved from this state by the offset amounts Xw and Yw stored beforehand in memory. However, it is also possible to design so that the position detection camera 7 and tool 4 are immediately moved by the offset amounts Xw and Yw stored beforehand in memory after the positional relationship between the position detection camera 7 and the reference hole 30 has been measured in the first attitude. In this case, the offset correction amounts ΔX and ΔY are calculated by Numerical Expression 2 using the measured values $\Delta X_1$ and $\Delta Y_1$ and the measured values $\Delta X_2$ and $\Delta Y_2$, and the operations shown in Numerical Expression 1 are performed using the calculated offset correction amounts ΔX and ΔY. As a result, the accurate offset amounts are obtained.

Numerical Expression 2

$$\Delta X = \Delta X_2 - \Delta X_1$$
$$\Delta Y = \Delta Y_2 - \Delta Y_1$$

The reference hole 30 formed in the window clamper 55 is used as the reference member. However, the reference member can be located in any other desired location besides the window clamper 55. Furthermore, the reference hole 30 is not necessarily limited to the rectangular shape. It can be triangular or circular instead. Furthermore, instead of a through-hole, the reference member can be a hole that has a bottom (i.e., a recess), or it can be a boss-form, rib-form or post-form projection on a flat surface.

Figure 6:
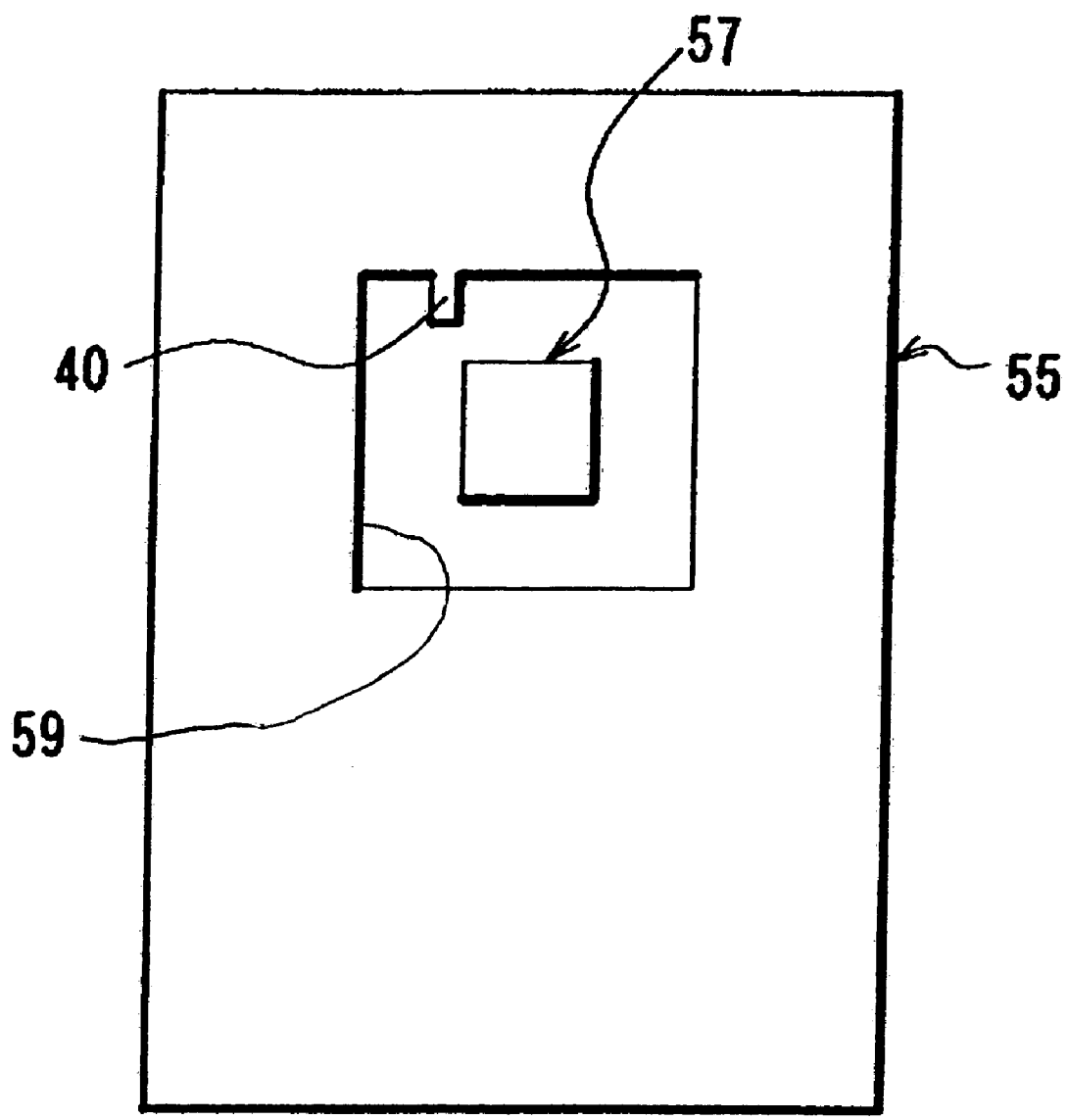
FIG. 6 is an enlarged top view of the window of another window clamper used in the present invention.

Furthermore, as shown in FIG. 6, instead of the reference hole 30, the window clamper 55 can be formed with a reference projection 40 that projects inward from the edge of the window 59. In this case, the positional relationship between the tool 4 and the reference projection 40 is detected by successively causing the tool 4 to contact the outer edge of this projection 40 from respective horizontal directions as shown in FIG. 6.

Instead of vertical surfaces of the window 57 of the window clamper 55, it is possible to use the inclined surfaces of the pointed end portion of the tool 4. It is also possible to form the edges of the reference member as inclined surfaces. In either of these structures, the tool 4 and the reference member will make contact with each other at different height positions of the tool 4 in accordance with the positional relationship between the tool 4 and the reference member as the tool 4 is lowered in the vertical direction. The positional relationship between the tool 4 and the reference member is thus measured.

Furthermore, the reference hole 30 is provided exclusively for use as a reference member in the shown embodiment. However, the reference member of the present invention is not limited to this. For instance, a portion of an existing component, e.g., an arbitrary portion of the edge of the window 59 of the window clamper 55 can be used as a reference member. It is also possible to use the outer edge of the semiconductor chip 57, that is the object to be processed, as a reference member.

In the shown embodiment, the position of the reference hole 30 is detected by subjecting the image of the reference hole 30 to image processing using the external shape of the reference hole 30 as a reference. However, instead of this structure, a reference pattern suitable for image processing can be printed, engraved or caused to project in the vicinity of the reference hole 30. In this case, the positional relationship between the position detection camera 7 and the reference hole 30 is measured by way of image processing using this reference pattern as a reference.

Furthermore, in the shown embodiment, the camera is used as the position detection imaging device. However, the position detection imaging device used in the present invention can be of other construction that is capable of detecting light such as a line sensor. Furthermore, any other contact type or non-contact type detector that is capable of detecting the position of the reference member can be used instead of the imaging device.

In the above description, a wire bonding apparatus is referred to. However, it goes without saying that the present invention is applicable to various other types of bonding apparatuses such as a die bonding apparatus, tape bonding apparatus, flip-chip bonding apparatus. Furthermore, the present invention is applied to any other type of processing apparatus that has an imaging device and a tool which are offset from each other.

What is claimed is:

1. An offset measurement method used in a processing apparatus that comprises:
    a position detection imaging device that images an object to be processed, and
    a tool which is installed in an offset fashion with respect to said position detection imaging device and performs a processing operation on said object to be processed, wherein
said offset measurement method comprises:
    a step in which said positional relationship between said position detection imaging device and said reference member disposed in a fixed position is measured by said position detection imaging device in a first attitude in which said position detection imaging device is caused to face said reference member,
    a step in which said positional relationship between said tool and said reference member is measured by causing said tool to approach said reference member and detecting said contact between said tool and said reference member in a second attitude in which said tool is caused to face said reference member, and
    a step in which an offset amount between said position detection imaging device and said tool is determined based upon said measurement results and amounts of movement of said position detection imaging device and said tool between said first attitude and second attitude.

2. The offset measurement method according to claim 1, wherein in said second attitude said tool and said reference member are caused to approach each other in a direction which crosses a direction of said processing operation of said tool.

3. The offset measurement method according to claim 1, wherein said detection of said contact between said tool and said reference member is accomplished based upon variations in a vibration that is applied to said tool.

4. The offset measurement method according to claim 2, wherein said detection of said contact between said tool and said reference member is accomplished based upon variations in a vibration that is applied to said tool.

5. A bonding apparatus comprises:
    a position detection imaging device that images an object to be bonded, and
    a tool which is installed so as to be offset with respect to said position detection imaging device and processes said object to be bonded,
    wherein said bonding apparatus is further provided with an operation control device which determines an offset amount between said position detection imaging device and said tool based upon:
    a measured value that is obtained when a positional relationship between said position detection imaging device and a reference member disposed in a fixed position is measured by said position detection imaging device in a first attitude in which said position detection imaging device is caused to approach said reference member, a measured value that is obtained when a positional relationship between said tool and said reference member is measured by detecting said contact between said tool and said reference member in a second attitude in which said tool is caused to approach said reference member, and amounts of movement of said position detection imaging device and said tool between said first attitude and second attitude.

6. A bonding apparatus comprises:

a position detection imaging device that images an object to be bonded, a tool which is installed so as to be offset with respect to said position detection imaging device and processes said object to be bonded, an XY table which moves said position detection imaging device and said tool as an integral unit, and a detection means which detects a contact between said tool and said object to be bonded based upon variations in ultrasonic vibrations applied to said tool, wherein said bonding apparatus is provided with an operation control device which determines an offset amount between said position detection imaging device and said tool based upon:

a measured value that is obtained when said positional relationship between said position detection imaging device and a reference member disposed in a fixed position is measured by said position detection imaging device in a first attitude in which said position detection imaging device is caused to approach said reference member by said XY table, a measured value that is obtained when said positional relationship between said tool and said reference member is measured as a result of said contact between said tool and said reference member being detected by said detection means on said basis of variations in said ultrasonic vibrations applied to said tool in a second attitude in which said tool is caused to approach said reference member by said XY table, and an amount of movement of said XY table between said first attitude and second attitude.

* * * * *